(12) United States Patent
Mukai

(10) Patent No.: US 10,110,196 B2
(45) Date of Patent: Oct. 23, 2018

(54) ELECTRONIC COMPONENT

(71) Applicant: Murata Manufacturing Co., Ltd., Nagaokakyo-shi, Kyoto-fu (JP)

(72) Inventor: Yusuke Mukai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 11 days.

(21) Appl. No.: 15/337,259

(22) Filed: Oct. 28, 2016

(65) Prior Publication Data

US 2017/0126198 A1    May 4, 2017

(30) Foreign Application Priority Data

Nov. 4, 2015 (JP) ................. 2015-216264

(51) Int. Cl.

| | |
|---|---|
| H03H 7/46 | (2006.01) |
| H03H 7/38 | (2006.01) |
| H03H 7/01 | (2006.01) |
| H03H 1/00 | (2006.01) |

(52) U.S. Cl.
CPC ............ H03H 7/46 (2013.01); H03H 7/0115 (2013.01); H03H 7/38 (2013.01); *H03H 2001/0085* (2013.01)

(58) Field of Classification Search
CPC ......... H03H 2001/0085; H03H 7/0115; H03H 7/38; H03H 7/46

USPC ................... 333/17.3, 32, 33, 124, 175, 185
See application file for complete search history.

(56) References Cited

U.S. PATENT DOCUMENTS

| | | | | |
|---|---|---|---|---|
| 2009/0051460 A1* | 2/2009 | Kimura | ............... | H01P 1/20345 333/32 |
| 2010/0283557 A1* | 11/2010 | Taniguchi | ........... | H01P 1/20345 333/204 |
| 2012/0119852 A1* | 5/2012 | Sasaki | ................. | H01P 1/20345 333/204 |

FOREIGN PATENT DOCUMENTS

| | | |
|---|---|---|
| EP | 2 009 787 A1 | 12/2008 |
| WO | 2007/119356 A1 | 10/2007 |

* cited by examiner

*Primary Examiner* — Rakesh Patel
(74) *Attorney, Agent, or Firm* — Keating & Bennett, LLP

(57) ABSTRACT

An electronic component includes a multilayer body, a filter provided at the multilayer body, an input/output terminal provided at the multilayer body, and an impedance-matching loop via inductor at the multilayer body and connected between the filter and the input/output terminal, and including an impedance-matching inductor conductor layer, and first and second impedance-matching via hole conductors extending from the impedance-matching inductor conductor layer in a laminate direction. A capacitor including at least two conductor layers respectively connected with the first and second impedance-matching via hole conductors may not be provided.

15 Claims, 13 Drawing Sheets

ELECTRONIC COMPONENT

CROSS REFERENCE TO RELATED APPLICATIONS

This application claims the benefit of priority to Japanese Patent Application 2015-216264 filed on Nov. 4, 2015. The entire contents of this application are hereby incorporated herein by reference.

BACKGROUND OF THE INVENTION

1. Field of the Invention

The present invention relates to an electronic component including a filter.

2. Description of the Related Art

A multilayer band pass filter, (referred to below simply as a filter) as described in International Publication No. 2007/119356, is an electronic component of the related art. The filter includes five inductor-capacitor (LC) parallel resonators. The five LC parallel resonators each include an inductor and a capacitor connected in parallel with each other.

The inductor includes a line electrode, a first via electrode, and a second via electrode. The line electrode is a substantially linear conductor layer extending in the front-rear direction. The first via electrode and the second via electrode extend from both ends of the line electrode to the lower side. The capacitor includes a capacitor electrode and a ground electrode. The capacitor electrode is connected with a lower end of the first via electrode. The ground electrode is connected with a lower end of the second via electrode. Such an LC parallel resonator forms a loop surface surrounded by the inductor and the capacitor. The five LC parallel resonators are arranged in line in the left-right direction so that the loop surfaces of adjacent LC parallel resonators face each other. Accordingly, adjacent LC parallel resonators are electromagnetically coupled with each other. The filter described above provides a band pass filter.

It is desired to increase the attenuation of a filter in a high frequency region outside a pass band. However, the attenuation of the band pass filter described above in a high frequency region outside a pass band is insufficient.

SUMMARY OF THE INVENTION

Preferred embodiments of the present invention provide an electronic component that is able to increase the attenuation in a high frequency region outside a pass band.

According to a preferred embodiment of the present invention, an electronic component includes a multilayer body including a plurality of insulator layers laminated in a laminate direction, a filter provided at the multilayer body, an input/output terminal provided at the multilayer body, and an impedance-matching loop via inductor. The impedance-matching loop via inductor is an impedance-matching inductor provided at the multilayer body and connected between the filter and the input/output terminal, and includes an impedance-matching inductor conductor layer, and first and second impedance-matching via hole conductors extending from the impedance-matching inductor conductor layer in the laminate direction. A capacitor including at least two conductor layers respectively connected with the first and second impedance-matching via hole conductors is not provided. A stray capacitance is generated between the first and second impedance-matching via hole conductors.

With a preferred embodiment of the present invention, the attenuation in the high frequency region outside the pass band is able to be increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
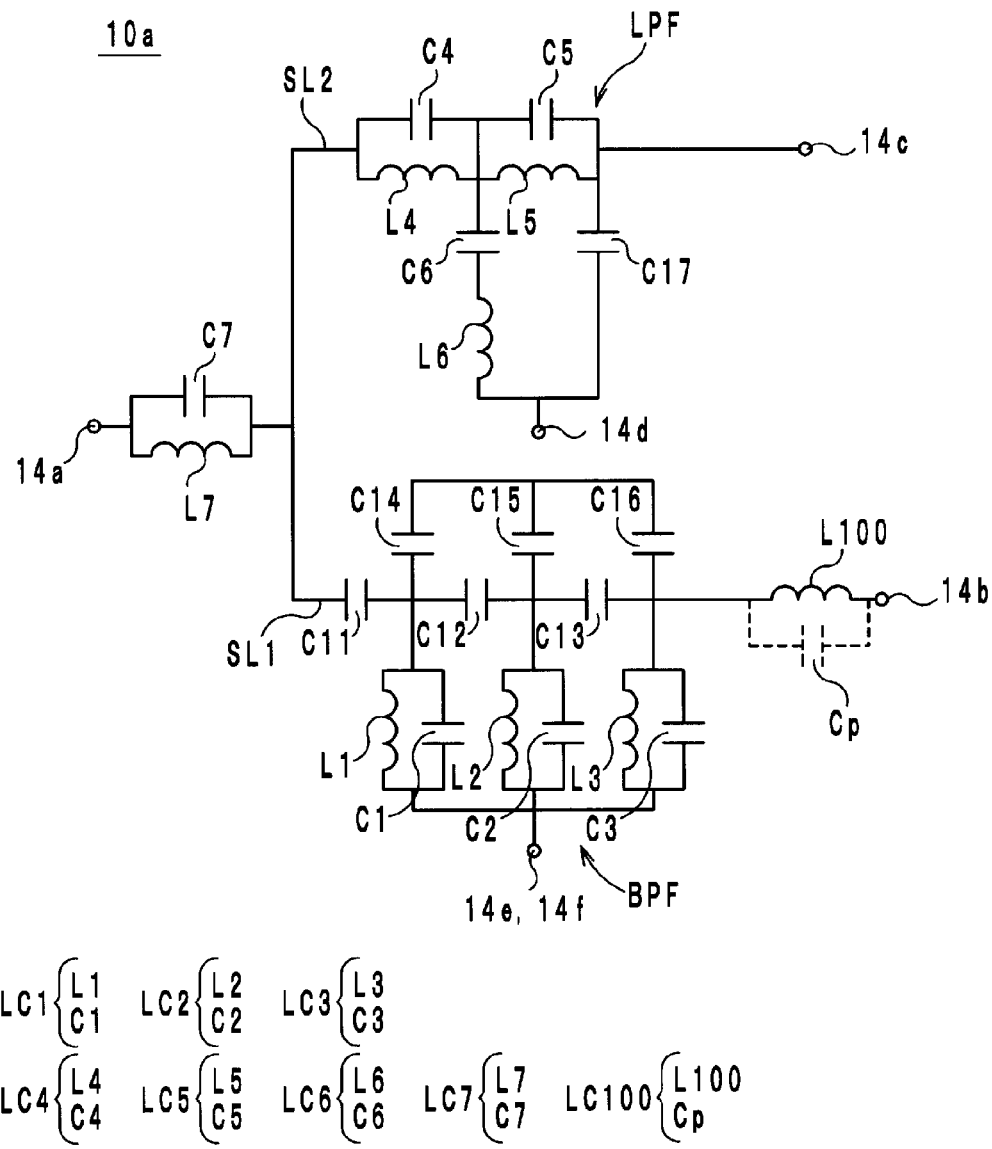
FIG. 1 is an equivalent circuit diagram of a diplexer according to a first preferred embodiment of the present invention.

A circuit configuration of a diplexer $10a$ according to a first preferred embodiment of the present invention is described below with reference to the drawings. FIG. 1 is an equivalent circuit diagram of the diplexer $10a$ according to the first preferred embodiment. A loop via inductor is an inductor including a via hole conductor connected with one end of an inductor conductor layer and a via hole conductor connected with the other end of the inductor conductor layer.

As shown in FIG. 1, the diplexer $10a$ includes signal paths SL1 and SL2, outer electrodes $14a$ to $14f$, inductors L1 to L7 and L100, and capacitors C1 to C7 and C11 to C17.

The outer electrodes $14a$ to $14c$ are input/output terminals for high frequency signals. The outer electrodes $14d$ to $14f$ are ground terminals connected with a ground potential. One end of the signal path SL1 is connected with the outer electrode 14a. The other end of the signal path SL1 is connected with the outer electrode 14b. One end of the signal path SL2 is connected with the outer electrode 14a. The other end of the signal path SL2 is connected with the outer electrode 14c. That is, the diplexer 10a includes a branch structure in which the signal path SL1 and the signal path SL2 are branched.

The capacitor C7 and the inductor L7 are connected in parallel and provide an inductor-capacitor (LC) parallel resonator LC7, and are located between the outer electrode 14a and a position at which the signal paths SL1 and SL2 are branched. Accordingly, one end of the LC parallel resonator LC7 is connected with the outer electrode 14a.

The capacitors C11 to C13 and the inductor L100, which is an example of an impedance-matching loop via inductor, are provided in the signal path SL1, and are connected in series in that order in a direction from the outer electrode 14a to the outer electrode 14b. A capacitor Cp is a stray capacitance generated at the inductor L100, and is connected in parallel with the inductor L100. Accordingly, the inductor L100 and the capacitor Cp provide an LC parallel resonator LC100.

The capacitor C1 and the inductor L1 are connected in parallel and provide an LC parallel resonator LC1. One end of the LC parallel resonator LC1 is connected with the signal path SL1 at a position between the capacitor C11 and the capacitor C12. The other end of the LC parallel resonator LC1 is connected with the outer electrodes 14e and 14f.

The capacitor C2 and the inductor L2, which is an example of a first loop via inductor, are connected in parallel and provide an LC parallel resonator LC2, which is an example of a first LC parallel resonator. One end of the LC parallel resonator LC2 is connected with the signal path SL1 at a position between the capacitor C12 and the capacitor C13. The other end of the LC parallel resonator LC2 is connected with the outer electrodes 14e and 14f. The inductor L1 and the inductor L2 are coupled by electromagnetic field coupling.

The capacitor C3 and the inductor L3, which is an example of a second loop via inductor, are connected in parallel and provide an LC parallel resonator LC3, which is an example of a second LC parallel resonator. One end of the LC parallel resonator LC3 is connected with the signal path SL1 at a position between the capacitor C13 and the inductor L100. The other end of the LC parallel resonator LC3 is connected with the outer electrodes 14e and 14f. The inductor L2 and the inductor L3 are coupled by electromagnetic field coupling.

One electrode of the capacitor C14 is connected with the signal path SL1 at a position between the capacitor C11 and the capacitor C12. One electrode of the capacitor C15 is connected with the signal path SL1 at a position between the capacitor C12 and the capacitor C13. One electrode of the capacitor C16 is connected with the signal path SL1 at a position between the capacitor C13 and the inductor L100. The other electrodes of the capacitors C14 to C16 are connected with one another.

The LC parallel resonators LC1 to LC3 and the capacitors C11 to C16 configured as described above provide, for example, a band pass filter BPF (an example of a first band pass filter) including a first pass band whose center frequency is about 5 GHz.

The capacitor C4 and the inductor L4 are connected in parallel and provide an LC parallel resonator LC4. The capacitor C5 and the inductor L5 are connected in parallel and provide an LC parallel resonator LC5. The LC parallel resonators LC4 and LC5 are provided in the signal path SL2, and are connected in series in that order in a direction from the outer electrode 14a to the outer electrode 14c. One end of the LC parallel resonator LC4 is connected with the other end of the LC parallel resonator LC7. The other end of the LC parallel resonator LC5 is connected with the outer electrode 14c.

The capacitor C6 and the inductor L6 are connected in series and provide an LC series resonator LC6. One end of the LC series resonator LC6 is connected with the signal path SL2 at a position between the LC parallel resonator LC4 and the LC parallel resonator LC5. The other end of the LC series resonator LC6 is connected with the outer electrode 14d.

One electrode of the capacitor C17 is connected between the LC parallel resonator LC5 and the outer electrode 14c. The other electrode of the capacitor C17 is connected with the outer electrode 14d.

The LC parallel resonators LC4, LC5, the LC series resonator LC6, and the capacitor C17 configured as described above provide a low pass filter LPF with a second pass band whose center frequency is lower than the first pass band. That is, the low pass filter LPF passes high frequency signals in the second pass band in an area between the outer electrode 14a and the outer electrode 14c.

The LC parallel resonators LC4 and LC5 do not pass high frequency signals with resonant frequencies in the area between the outer electrode 14a and the outer electrode 14c. The resonant frequencies of the LC parallel resonators LC4 and LC5 are, for example, frequencies close to a high frequency side of the second pass band. The LC series resonator LC6 does not pass high frequency signals with a resonant frequency of the LC series resonator LC6 in the area between the outer electrode 14a and the outer electrode 14c.

The diplexer 10a configured in this way defines and functions as a diplexer as described above. For example, a high frequency signal in the first pass band (for example, about 5 GHz), among high frequency signals input from the outer electrode 14a, is output from the outer electrode 14b. A high frequency signal in the second pass band (for example, about 2 GHz), among high frequency signals input from the outer electrode 14a, is output from the outer electrode 14c. Grounds corresponding to the respective filters of the diplexer 10a are isolated from each other. Since the grounds are isolated from each other, the attenuation outside the pass band of the low pass filter is able to be improved.

Figure 2:
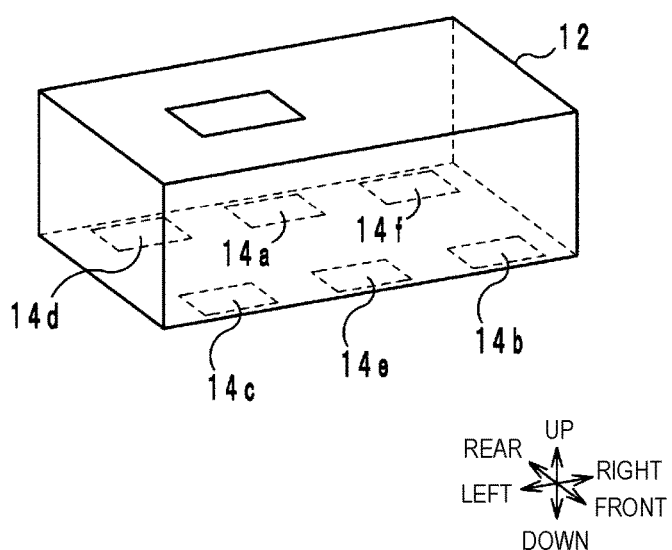
FIG. 2 is an external perspective view of the diplexer according to the first preferred embodiment of the present invention.
Figure 3:
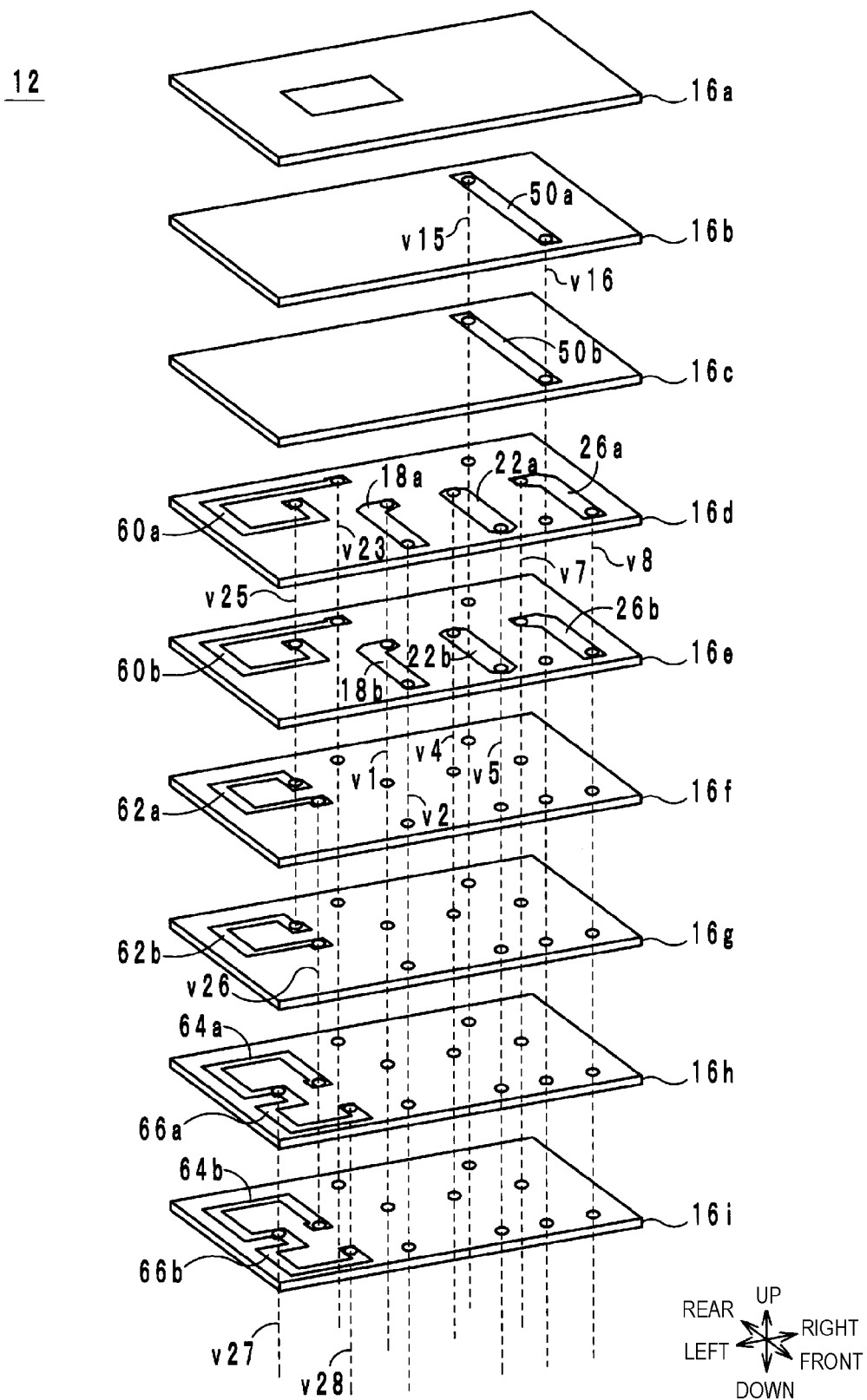
FIG. 3 is an exploded perspective view of the diplexer according to the first preferred embodiment of the present invention.
Figure 4:
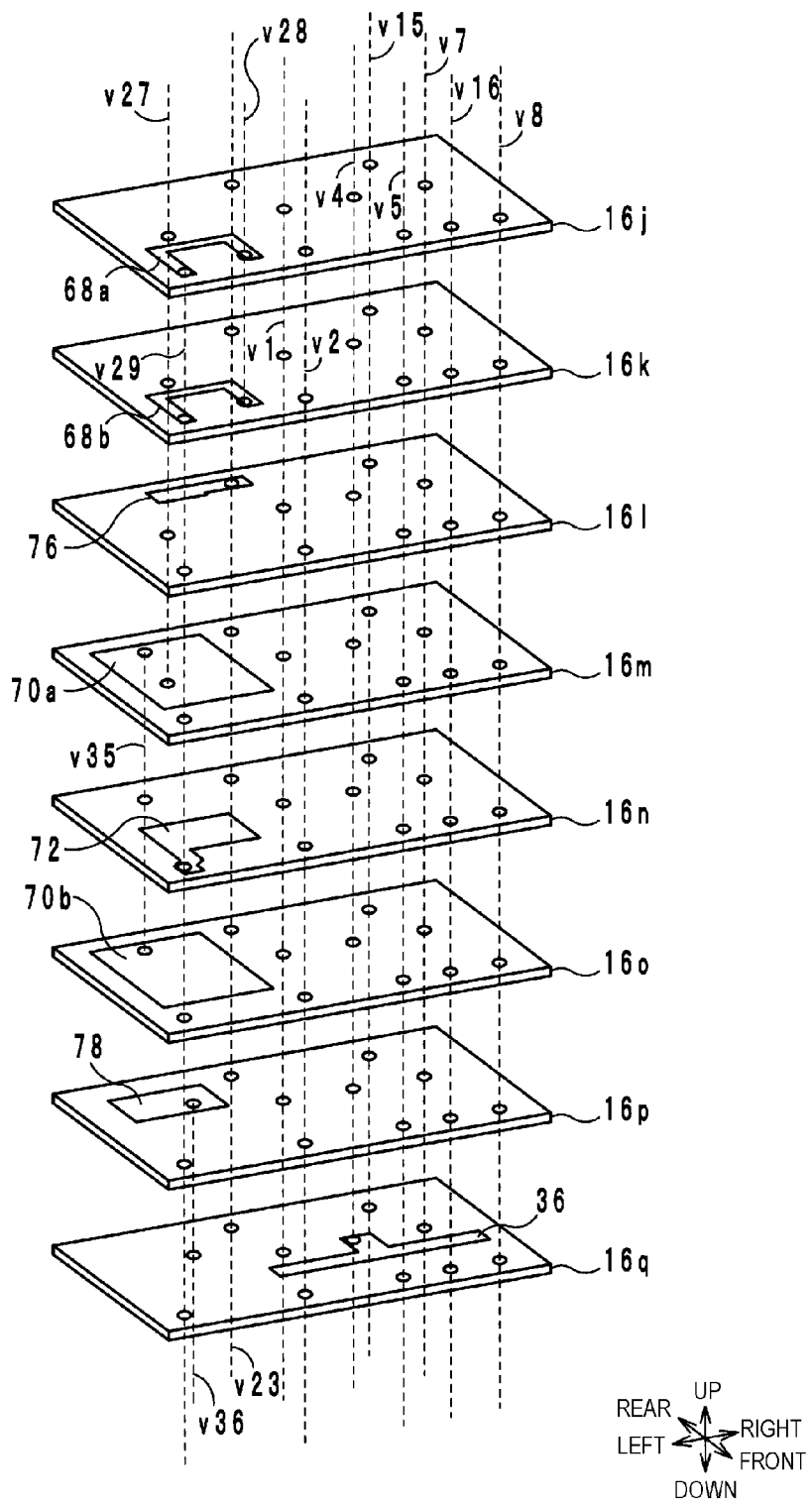
FIG. 4 is an exploded perspective view of the diplexer according to the first preferred embodiment of the present invention.
Figure 5:
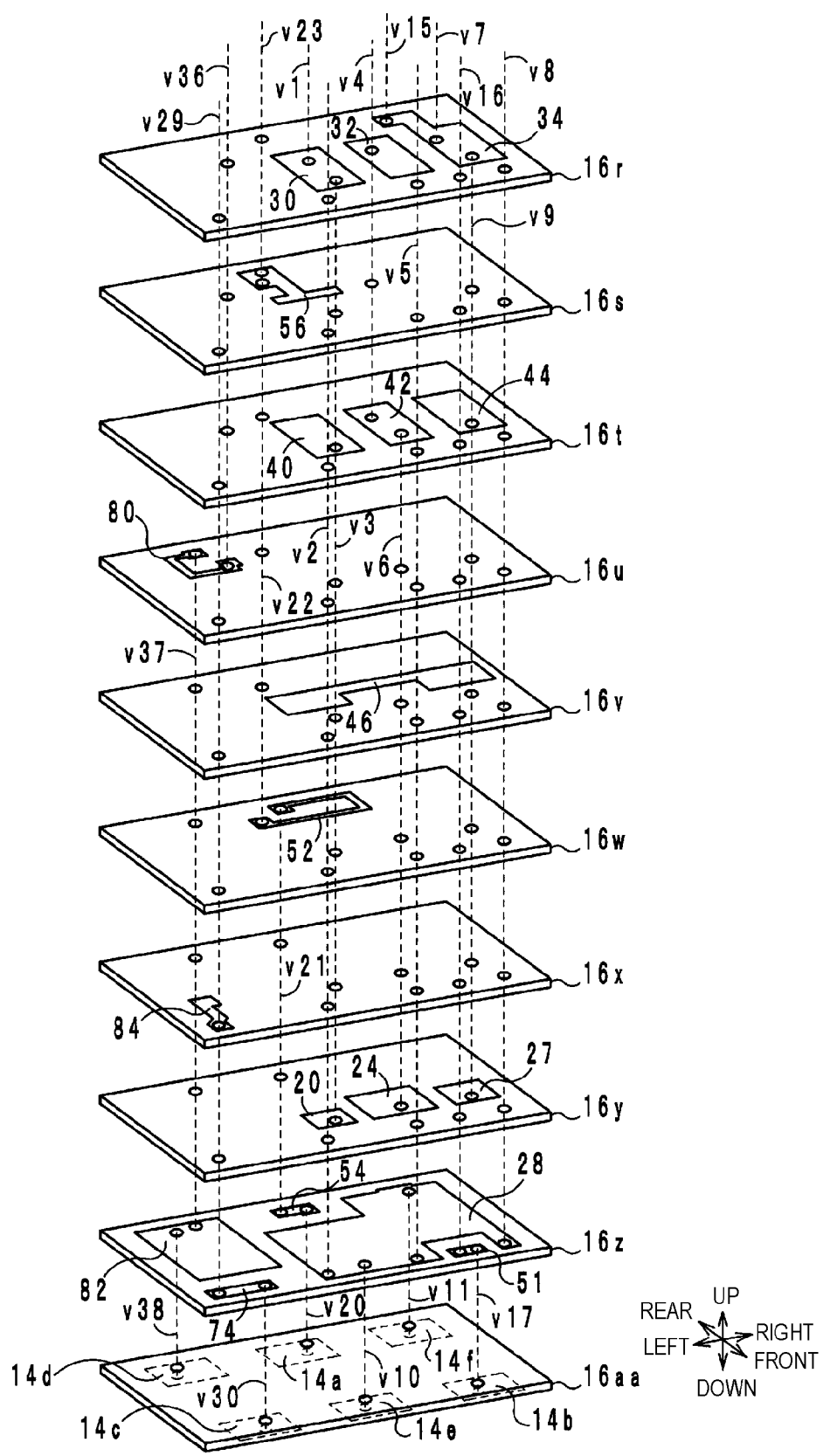
FIG. 5 is an exploded perspective view of the diplexer according to the first preferred embodiment of the present invention.
Figure 6:
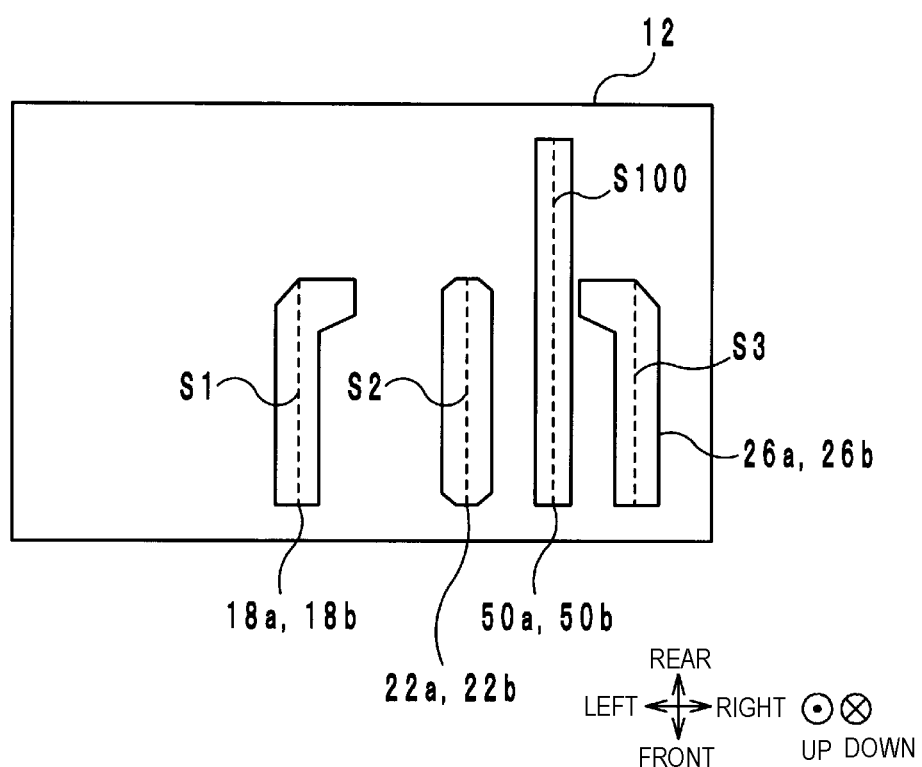
FIG. 6 is a perspective view of insulator layers of the diplexer from the upper side according to the first preferred embodiment of the present invention.

A specific configuration of the diplexer 10a is described below with reference to the drawings. FIG. 2 is an exploded perspective view of the diplexer 10a. FIGS. 3 to 5 are exploded perspective views of the diplexer 10a. FIG. 6 is a perspective view of insulator layers 16b to 16d of the diplexer 10a from the upper side. For clarity, FIG. 6 only illustrates the inductors L1 to L3 and L100. In the diplexer 10a, a laminate direction of a multilayer body 12 is defined as an up-down direction. When the diplexer 10a is viewed from the upper side, a direction in which a long side of an upper surface of the diplexer 10a extends is defined as a left-right direction (an example of a second direction), and a direction in which a short side of the upper surface of the diplexer 10a extends is defined as a front-rear direction (an example of a first direction). The up-down direction, front-rear direction, and left-right direction are orthogonal or substantially orthogonal to one another.

As shown in FIGS. 2 to 5, the diplexer 10a includes, as its specific configuration, the multilayer body 12, the outer electrodes 14a to 14f, inductor conductor layers 18a, 18b, 22a, 22b, 26a, 26b, 50a, 50b, 52, 60a, 60b, 62a, 62b, 64a, 64b, 66a, 66b, 68a, 68b, and 80, capacitor conductor layers 20, 24, 27, 30, 32, 34, 36, 40, 42, 44, 46, 56, 70a, 70b, 72, 76, 78, and 84, ground conductor layers 28 and 82, connection conductor layers 51, 54, and 74, and via hole conductors v1 to v11, v15 to v17, v20 to v23, v25 to v30, and v35 to v38.

As shown in FIG. 2, the multilayer body 12 includes a rectangular-parallelepiped or a substantially rectangular-parallelepiped shape, and is provided by laminating insulator layers 16a to 16z, and 16aa in that order from the upper side to the lower side. A bottom surface of the multilayer body 12 is a mount surface that is located at the lower side of the multilayer body 12, and faces a circuit board when the diplexer 10a is mounted on the circuit board.

The insulator layers 16a to 16z and 16aa each include a rectangular or substantially rectangular shape with a long side that extends in the left-right direction when viewed from the upper side, and includes, for example, ceramic. Upper surfaces of the insulator layers 16a to 16z, and 16aa are referred to as top surfaces, and lower surfaces of the insulator layers 16a to 16z, and 16aa are referred to as back surfaces.

For example, the outer electrodes 14a to 14f are provided at the bottom surface of the multilayer body 12, but are not provided at the front surface, rear surface, right surface, or left surface of the multilayer body 12. The outer electrodes 14a to 14f include rectangular or substantially rectangular shapes. The outer electrodes 14c, 14e, and 14b are arranged in line in that order from the left side to the right side along the long side at the front side of the bottom surface of the multilayer body 12. The outer electrodes 14d, 14a, and 14f are arranged in line in that order from the left side to the right side along the long side at the rear side of the bottom surface of the multilayer body 12. The outer electrodes 14a to 14f each are manufactured preferably by applying nickel plating and tin plating or nickel plating and gold plating on a base electrode that includes, for example, copper.

The LC parallel resonator LC7 is described first. The inductor L7 is provided at the multilayer body 12 and includes the inductor conductor layer 52. The inductor conductor layer 52 is a conductor layer provided at or near the center of the long side at the rear side of the top surface of the insulator layer 16w, and includes a linear or a substantially linear shape looped in the clockwise direction when viewed from the upper side. An end portion at the upstream side in the clockwise direction of the inductor conductor layer 52 is referred to as an upstream end, and an end portion at the downstream side in the clockwise direction of the inductor conductor layer 52 is referred to as a downstream end.

One end of the inductor L7, specifically, the upstream end of the inductor conductor layer, is connected with the outer electrode 14a via the connection conductor layer 54 and the via hole conductors v20 and v21. The connection conductor layer 54 is a conductor layer provided at or near the center of the long side at the rear side of the top surface of the insulator layer 16z, and includes a linear or a substantially linear shape extending in the left-right direction. The via hole conductor v20 penetrates through the insulator layers 16z and 16aa in the up-down direction, and connects a right end of the connection conductor layer 54 with the outer electrode 14a. The via hole conductor v21 penetrates through the insulator layers 16w to 16y in the up-down direction, and connects the upstream end of the inductor conductor layer 52 with a left end of the connection conductor layer 54.

The capacitor C7 has a very small capacitance. The capacitor conductor layer 56 and the inductor conductor layer 52 overlap each other when viewed from the upper side.

A configuration at the signal path SL1 side is described below. The capacitors C11 to C13 and the inductor L100 are described first. The capacitor C11 is provided at the multilayer body 12 and includes the capacitor conductor layers 30, 40, and 56. The capacitor conductor layer 56 is a conductor layer provided at or near the center of the top surface of the insulator layer 16s, and includes a strip-shaped or a substantially strip-shaped portion extending in the left-right direction. The capacitor conductor layer 30 is a conductor layer provided at or near the center of the top surface of the insulator layer 16r, and includes a rectangular or a substantially rectangular shape. The capacitor conductor layer 30 faces the capacitor conductor layer 56, and the insulator layer 16r is located between the capacitor conductor layer 30 and the capacitor conductor layer 56. The capacitor conductor layer 40 is a conductor layer provided at or near the center of the top surface of the insulator layer 16t, and includes a rectangular or a substantially rectangular shape. The capacitor conductor layer 40 faces the capacitor conductor layer 56 with the insulator layer 16s located between the capacitor conductor layer 40 and the capacitor conductor layer 56.

One electrode of the capacitor C11 is connected with the other end of the inductor L7 through the via hole conductor v22. Accordingly, the capacitor conductor layer 56 is connected with the downstream end of the inductor conductor layer 52 through the via hole conductor v22. The via hole conductor v22 penetrates through the insulator layers 16s to 16v in the up-down direction, and connects the downstream end of the inductor conductor layer 52 with the capacitor conductor layer 56.

The capacitor C12 is provided at the multilayer body 12 and includes the capacitor conductor layers 30 and 36. The capacitor conductor layer 36 is a conductor layer provided in a right half region of the top surface of the insulator layer 16q, and includes a strip shape or a substantially strip shape extending in the left-right direction. The capacitor conductor layer 36 faces the capacitor conductor layer 30 with the insulator layer 16q located between the capacitor conductor layer 36 and the capacitor conductor layer 30. Accordingly, the other electrode of the capacitor C11, included in the capacitor conductor layer 30, is connected with one electrode of the capacitor C12, also in the capacitor conductor layer 30.

The capacitor C13 is provided at the multilayer body 12 and includes the capacitor conductor layers 34 and 36. The capacitor conductor layer 34 is a conductor layer provided at a right end of the top surface of the insulator layer 16r, and includes a rectangular or a substantially rectangular shape. The capacitor conductor layer 36 faces the capacitor conductor layer with the insulator layer 16q located between the capacitor conductor layer 36 and the capacitor conductor layer 34. Accordingly, the other electrode of the capacitor C12, included in the capacitor conductor layer 36, is connected with one electrode of the capacitor C13, also in the capacitor conductor layer 36.

The inductor L100, which is an example of the impedance-matching loop via inductor, is provided at the multilayer body 12, and includes the inductor conductor layers 50a and 50b, which are examples of an impedance-matching inductor conductor layer, and the via hole conductors v15 and v16. The inductor conductor layers 50a and 50b are conductor layers respectively provided in right half regions of the top surfaces of the insulator layers 16b and 16c, and include linear or substantially linear shapes extending in the front-rear direction. The inductor conductor layers 50a and 50b include the same or substantially the same shape, and overlap each other when viewed from the upper side. Preferably, the inductor conductor layers 50a and 50b are aligned with one another when viewed from the upper side. The via hole conductor v15, which is an example of a first impedance-matching via hole conductor, penetrates through the insulator layers 16b to 16q in the up-down direction, and connects rear ends of the inductor conductor layers 50a and 50b with the capacitor conductor layer 34. Accordingly, the other electrode of the capacitor C13, included in the capacitor conductor layer 34, is connected with one end of the inductor L100, at a lower end of the via hole conductor v15.

The via hole conductor v16, which is an example of a second impedance-matching via hole conductor, penetrates through the insulator layers 16b to 16y in the up-down direction, and is connected with front ends of the inductor conductor layers 50a and 50b. As described above, the inductor L100 includes the via hole conductors v15 and v16 extending from the inductor conductor layers 50a and 50b to the lower side, preferably in a laminate direction. Accordingly, as shown in FIG. 6, a rectangular or a substantially rectangular loop surface S100, which is an example of an impedance-matching loop surface, is surrounded by the inductor conductor layers 50a and 50b and the via hole conductors v15 and v16. The loop surface S100 is a flat surface perpendicular or substantially perpendicular to the left-right direction.

The other end of the inductor L100, at a lower end of the via hole conductor v16, is connected with the outer electrode 14b via the connection conductor layer 51 and the via hole conductor v17. The connection conductor layer 51 is a conductor layer provided at or near the front right corner of the top surface of the insulator layer 16z, and includes a linear or a substantially linear shape extending in the left-right direction. The lower end of the via hole conductor v16 is connected with a left end of the connection conductor layer 51. The via hole conductor v17 penetrates through the insulator layers 16z and 16aa in the up-down direction, and connects a right end of the connection conductor layer 51 with the outer electrode 14b.

A stray capacitance is generated between the via hole conductor v15 and the via hole conductor v16. This stray capacitance is the capacitor Cp. Accordingly, the capacitor Cp is connected in parallel with the inductor L100. The inductor L100 and the capacitor Cp provide the LC parallel resonator LC100.

The LC parallel resonator LC100 is not provided with a capacitor including at least two capacitor conductor layers respectively connected with the via hole conductors v15 and v16. That is, a capacitor connected in parallel with the inductor L100 is not provided. Accordingly, the LC parallel resonator LC100 includes only the inductor L100.

The LC parallel resonator LC1 connected with the signal path SL1 is described below. The inductor L1 includes the inductor conductor layers 18a and 18b and the via hole conductors v1 and v2. The inductor conductor layers 18a and 18b are conductor layers respectively provided at or near the centers of the top surfaces of the insulator layers 16d and 16e, and include linear or substantially linear shapes extending in the front-rear direction. The inductor conductor layers 18a and 18b include the same or substantially the same shape, and overlap each other when viewed from the upper side. Preferably, the inductor conductor layers 18a and 18b are aligned with one another when viewed from the upper side. The via hole conductor v1 penetrates through the insulator layers 16d to 16q in the up-down direction, and connects rear ends of the inductor conductor layers 18a and 18b with the capacitor conductor layer 30. Accordingly, the other electrode of the capacitor C11, included in the capacitor conductor layer 30, and one electrode of the capacitor C12, also in the capacitor conductor layer 30, are connected with one end of the inductor L1 at one end of the via hole conductor v1.

The via hole conductor v2 penetrates through the insulator layers 16d to 16y in the up-down direction, and is connected with front ends of the inductor conductor layers 18a and 18b. As described above, the inductor L1 includes the via hole conductors v1 and v2 extending from the inductor conductor layers 18a and 18b to the lower side, preferably in the laminate direction. Accordingly, as shown in FIG. 6, a rectangular or a substantially rectangular loop surface S1 is surrounded by the inductor conductor layers 18a and 18b and the via hole conductors v1 and v2. The loop surface S1 is a flat surface perpendicular or substantially perpendicular to the left-right direction.

The other end of the inductor L1, at a lower end of the via hole conductor v2, is connected with the outer electrodes 14e and 14f via the ground conductor layer 28 and the via hole conductors v10 and v11. The ground conductor layer 28 is a conductor layer provided in a right half region of the top surface of the insulator layer 16z, and includes a planar or a substantially planar shape. The lower end of the via hole conductor v2 is connected with the ground conductor layer 28. The via hole conductors v10 and v11 penetrate through the insulator layers 16z and 16aa in the up-down direction, and connect the ground conductor layer 28 with the outer electrodes 14e and 14f.

The capacitor C1 includes the capacitor conductor layer 20 and the ground conductor layer 28. The capacitor conductor layer 20 is a conductor layer provided at or near the center of the top surface of the insulator layer 16y, and includes a rectangular or a substantially rectangular shape. The capacitor conductor layer 20 faces the ground conductor layer 28 with the insulator layer 16y located between the capacitor conductor layer 20 and the ground conductor layer 28.

One electrode of the capacitor C1, included in the capacitor conductor layer 20, is connected with one end of the inductor L1, at the lower end of the via hole conductor v1, via the capacitor conductor layer 30 and the via hole conductor v3. The via hole conductor v3 penetrates through the insulator layers 16r to 16x in the up-down direction, and connects the capacitor conductor layers 40, 30, and 20 with one another.

The other electrode of the capacitor C1, in the ground conductor layer 28, is connected with the outer electrodes 14e and 14f through the via hole conductors v10 and v11.

The LC parallel resonator LC2 (an example of the first LC parallel resonator) is described below. The inductor L2 (an example of the first loop via inductor) includes the inductor conductor layers 22a and 22b, and the via hole conductors v4 and v5. The inductor conductor layers 22a and 22b (examples of a first inductor conductor layer) are conductor layers respectively provided at the right sides of the inductor conductor layers 18a and 18b at the top surfaces of the insulator layers 16d and 16e, and include linear or substantially linear shapes extending in the front-rear direction. The inductor conductor layers 22a and 22b include the same or substantially the same shape, and overlap each other when viewed from the upper side. Preferably, the inductor conductor layers 22a and 22b are aligned with one another when viewed from the upper side. The via hole conductor v4 (an example of a first via hole conductor) penetrates through the insulator layers 16d to 16s in the up-down direction, and connects rear ends of the inductor conductor layers 22a and 22b with the capacitor conductor layers 32, 36, and 42. Accordingly, the other electrode of the capacitor C12, in the capacitor conductor layer 36, and one electrode of the capacitor C13, also in the capacitor conductor layer 36, are connected with one end of the inductor L2 by the via hole conductor v4.

The via hole conductor v5 penetrates through the insulator layers 16d to 16y in the up-down direction, and is connected with front ends of the inductor conductor layers 22a and 22b. As described above, the inductor L2 includes the via hole conductors v4 and v5 extending from the inductor conductor layers 22a and 22b to the lower side, preferably in the laminate direction. Accordingly, as shown in FIG. 6, a rectangular or a substantially rectangular loop surface S2 (an example of a first loop surface) is surrounded by the inductor conductor layers 22a and 22b and the via hole conductors v4 and v5. The loop surface S2 is a flat surface perpendicular or substantially perpendicular to the left-right direction, and faces the loop surface S1 at the right side of the loop surface S1. Accordingly, the inductor L1, which is included in the LC parallel resonator LC1, is electromagnetically coupled with the inductor L2, which is included in the LC parallel resonator LC2.

The other end of the inductor L2, at a lower end of the via hole conductor v5, is connected with the outer electrodes 14e and 14f via the ground conductor layer 28 and the via hole conductors v10 and v11.

The capacitor C2 includes the capacitor conductor layer 24 and the ground conductor layer 28. The capacitor conductor layer 24 is a conductor layer provided at the right side of the capacitor conductor layer 20 at the top surface of the insulator layer 16y, and includes a rectangular or a substantially rectangular shape. The capacitor conductor layer 24 faces the ground conductor layer 28 with the insulator layer 16y located between the capacitor conductor layer 24 and the ground conductor layer 28.

One electrode of the capacitor C2, included in the capacitor conductor layer 24, is connected with one end of the inductor L2, at the lower end of the via hole conductor v4, via the capacitor conductor layers 32 and 42 and the via hole conductor v6. The capacitor conductor layer 32 is a conductor layer provided at the right side of the capacitor conductor layer 30 at the top surface of the insulator layer 16r, and includes a rectangular or a substantially rectangular shape. The capacitor conductor layer 42 is a conductor layer provided at the right side of the capacitor conductor layer 40 at the top surface of the insulator layer 16t, and includes a rectangular or a substantially rectangular shape. The via hole conductor v6 penetrates through the insulator layers 16t to 16x in the up-down direction, and connects the capacitor conductor layers 32 and 42 with the capacitor conductor layer 24.

The other electrode of the capacitor C2, in the ground conductor layer 28, is connected with the outer electrodes 14e and 14f through the via hole conductors v10 and v11.

The LC parallel resonator LC3 (an example of the second LC parallel resonator) is described below. The inductor L3 (an example of the second loop via inductor) includes the inductor conductor layers 26a and 26b, and the via hole conductors v7 and v8. The inductor conductor layers 26a and 26b (examples of a second inductor conductor layer) are conductor layers respectively provided at the right sides of the inductor conductor layers 22a and 22b at the top surfaces of the insulator layers 16d and 16e, and include linear or substantially linear shapes extending in the front-rear direction. The inductor conductor layers 26a and 26b include the same or substantially the same shape, and overlap each other when viewed from the upper side. Preferably, the inductor conductor layers 26a and 26b are aligned with one another when viewed from the upper side. The via hole conductor v7 (an example of a third via hole conductor) penetrates through the insulator layers 16d to 16q in the up-down direction, and connects rear ends of the inductor conductor layers 26a and 26b with the capacitor conductor layer 34. Accordingly, the other electrode of the capacitor C13, one end of the inductor L100 (a lower end of the via hole conductor v15), and one end of the inductor L3 (a lower end of the via hole conductor v7) are connected with one another.

The via hole conductor v8 (an example of a fourth via hole conductor) penetrates through the insulator layers 16d to 16y in the up-down direction, and is connected with front ends of the inductor conductor layers 26a and 26b. As described above, the inductor L3 includes the via hole conductors v7 and v8 extending from the inductor conductor layers 26a and 26b to the lower side, preferably in the laminate direction. Accordingly, as shown in FIG. 6, a rectangular or a substantially rectangular loop surface S3 (an example of a second loop surface) is surrounded by the inductor conductor layers 26a and 26b and the via hole conductors v7 and v8. The loop surface S3 is a flat surface perpendicular or substantially perpendicular to the left-right direction, and faces the loop surface S2 at the right side of the loop surface S2. Accordingly, the inductor L2, which is included in the LC parallel resonator LC2, is electromagnetically coupled with the inductor L3, which is included in the LC parallel resonator LC3.

The other end of the inductor L3, at a lower end of the via hole conductor v8, is connected with the outer electrodes 14e and 14f via the ground conductor layer 28 and the via hole conductors v10 and v11.

The capacitor C3 includes the capacitor conductor layer 27 and the ground conductor layer 28. The capacitor conductor layer 27 is a conductor layer provided at the right side of the capacitor conductor layer 24 at the top surface of the insulator layer 16y, and includes a rectangular or a substantially rectangular shape. The capacitor conductor layer 27 faces the ground conductor layer 28 with the insulator layer 16y located between the capacitor conductor layer 27 and the ground conductor layer 28.

One electrode of the capacitor C3, included in the capacitor conductor layer 27, is connected with one end of the inductor L3, at a lower end of the via hole conductor v7, via the capacitor conductor layers 34 and 44 and the via hole conductor v9. The capacitor conductor layer 34 is a conductor layer provided at the right side of the capacitor conductor layer 32 at the top surface of the insulator layer 16r, and includes a rectangular or a substantially rectangular shape. The capacitor conductor layer 44 is a conductor layer provided at the right side of the capacitor conductor layer 42 at the top surface of the insulator layer 16t, and includes a rectangular or a substantially rectangular shape. The via hole conductor v9 penetrates through the insulator layers 16r to 16x in the up-down direction, and connects the capacitor conductor layers 34 and 44 with the capacitor conductor layer 27.

The other electrode of the capacitor C3, in the ground conductor layer 28, is connected with the outer electrodes 14e and 14f through the via hole conductors v10 and v11.

The capacitors C14 to C16 are described below. The capacitor C14 includes the capacitor conductor layer 40 and the capacitor conductor layer 46. The capacitor conductor layer 46 is a conductor layer provided in a right half region of the top surface of the insulator layer 16v, and includes a strip shape or a substantially strip shape extending in the left-right direction. The capacitor conductor layer 40 faces the capacitor conductor layer 46 with the insulator layers 16t and 16u located between the capacitor conductor layer 40 and the capacitor conductor layer 46. One electrode of the capacitor C14, included in the capacitor conductor layer 40, is connected with one end of the inductor L1, at the lower end of the via hole conductor v1, via the capacitor conductor layer 30 and the via hole conductor v3.

The capacitor C15 includes the capacitor conductor layer 42 and the capacitor conductor layer 46. The capacitor conductor layer 42 faces the capacitor conductor layer 46 with the insulator layers 16t and 16u located between the capacitor conductor layer 42 and the capacitor conductor layer 46. One electrode of the capacitor C15, included in the capacitor conductor layer 42, is connected with one end of the inductor L2, at a lower end of the via hole conductor v4.

The capacitor C16 includes the capacitor conductor layer 44 and the capacitor conductor layer 46. The capacitor conductor layer 44 faces the capacitor conductor layer 46 with the insulator layers 16t and 16u located between the capacitor conductor layer 44 and the capacitor conductor layer 46. One electrode of the capacitor C16, included in the capacitor conductor layer 44, is connected with one end of the inductor L3, at a lower end of the via hole conductor v7, via the capacitor conductor layer 34 and the via hole conductor v9.

The other electrodes of the capacitors C14 to C16, included in the capacitor conductor layer 46, are connected with one another.

The relationship among the loop surfaces S2, S3, and S100 is described now. As shown in FIG. 6, the loop surface S100 faces the loop surfaces S2 and S3. In the first preferred embodiment, the loop surface S100 is located between the loop surfaces S2 and S3 in the left-right direction when viewed from the upper side. Accordingly, the inductor L100 is electromagnetically coupled with the inductors L2 and L3.

The inductor conductor layers 50a and 50b are longer than the inductor conductor layers 18a, 18b, 22a, 22b, 26a, and 26b. Further, the via hole conductor v16 is longer than the via hole conductors v2, v5, and v8. Accordingly, the loop surfaces S2 and S3 are accommodated within the loop surface S100 and do not protrude from the loop surface S100 when viewed from the right side.

A configuration at the signal path SL2 side is described below. The LC parallel resonator LC4 is described first. The inductor L4 is provided at the multilayer body 12, and includes the inductor conductor layers 60a, 60b, 62a, 62b, 64a, and 64b, and the via hole conductors v25 and v26. The inductor conductor layers 60a and 60b are conductor layers respectively provided at or near the rear left corners of the insulator layers 16d and 16e, and include linear or substantially linear shapes looped in the counterclockwise direction when viewed from the upper side. The inductor conductor layers 60a and 60b include the same or substantially the same shape, and overlap each other when viewed from the upper side. Preferably, the inductor conductor layers 60a and 60b are aligned with one another when viewed from the upper side. The inductor conductor layers 62a and 62b are conductor layers respectively provided at or near the rear left corners of the insulator layers 16f and 16g, and include linear or substantially linear shapes looped in the counterclockwise direction when viewed from the upper side. The inductor conductor layers 62a and 62b include the same or substantially the same shape, and overlap each other when viewed from the upper side. Preferably, the inductor conductor layers 62a and 62b are aligned with one another when viewed from the upper side. The inductor conductor layers 64a and 64b are conductor layers respectively provided at or near the rear left corners of the insulator layers 16h and 16i, and include linear or substantially linear shapes looped in the counterclockwise direction when viewed from the upper side. The inductor conductor layers 64a and 64b include the same or substantially the same shape, and overlap each other when viewed from the upper side. Preferably, the inductor conductor layers 64a and 64b are aligned with one another when viewed from the upper side. In the following description, end portions at the upstream side in the counterclockwise direction of the inductor conductor layers 60a, 60b, 62a, 62b, 64a, and 64b are referred to as upstream ends, and end portions at the downstream side in the counterclockwise direction of the inductor conductor layers 60a, 60b, 62a, 62b, 64a, and 64b are referred to as downstream ends.

The via hole conductor v25 penetrates through the insulator layers 16d to 16f in the up-down direction, and connects the downstream ends of the inductor conductor layers 60a and 60b with the upstream ends of the inductor conductor layers 62a and 62b. The via hole conductor v26 penetrates through the insulator layers 16f to 16h in the up-down direction, and connects the downstream ends of the inductor conductor layers 62a and 62b with the upstream ends of the inductor conductor layers 64a and 64b. Accordingly, the inductor L4 includes a spiral or a substantially spiral shape extending to the lower side while looped in the counterclockwise direction when viewed from the upper side.

One end of the inductor L4, which includes the upstream ends of the inductor conductor layers 60a and 60b, is connected with the other end of the inductor L7, which includes the downstream end of the inductor conductor layer 52, via the capacitor conductor layer 56 and the via hole conductors v22 and v23. The via hole conductor v23 penetrates through the insulator layers 16d to 16r in the up-down direction, and connects the upstream ends of the inductor conductor layers 60a and 60b with the capacitor conductor layers 56 and 76.

The capacitor C4 includes the capacitor conductor layers 70a and 76. The capacitor conductor layer 70a is a conductor layer provided in a left half region of the top surface of the insulator layer 16m, and includes a rectangular or a substantially rectangular shape. The capacitor conductor layer 76 is a conductor layer provided in a left half region of the insulator layer 16l, and includes a strip shape or a substantially strip shape extending in the left-right direction. The capacitor conductor layer 76 faces the capacitor conductor layer 70a with the insulator layer 16l located between the capacitor conductor layer 76 and the capacitor conductor layer 70a.

One electrode of the capacitor C4, included in the capacitor conductor layer 76, is connected with one end of the inductor L4, which includes the upstream ends of the inductor conductor layers 60a and 60b, through the via hole conductor v23. The other electrode of the capacitor C4, included in the capacitor conductor layer 70a, is connected with the other end of the inductor L4, which includes the downstream ends of the inductor conductor layers 64a and 64b, through the via hole conductor v27. The via hole conductor v27 penetrates through the insulator layers 16h to 16l in the up-down direction, and connects the downstream ends of the inductor conductor layers 64a and 64b with the capacitor conductor layer 70a.

The LC parallel resonator LC5 is described below. The inductor L5 is provided at the multilayer body 12, and includes the inductor conductor layers 66a, 66b, 68a, and 68b, and the via hole conductor v28. The inductor conductor layers 66a and 66b are conductor layers respectively provided at or near the front left corners of the insulator layers 16h and 16i, and include linear or substantially linear shapes looped in the counterclockwise direction when viewed from the upper side. The inductor conductor layers 66a and 66b include the same or substantially the same shape, and overlap each other when viewed from the upper side. Preferably, the inductor conductor layers 66a and 66b are aligned with one another when viewed from the upper side. The inductor conductor layers 68a and 68b are conductor layers respectively provided at or near the front left corners of the insulator layers 16j and 16k, and include linear or substantially linear shapes looped in the counterclockwise direction when viewed from the upper side. The inductor conductor layers 68a and 68b include the same or substantially the same shape, and overlap each other when viewed from the upper side. Preferably, the inductor conductor layers 68a and 68b are aligned with one another when viewed from the upper side. In the following description, end portions at the upstream side in the counterclockwise direction of the inductor conductor layers 66a, 66b, 68a, and 68b are referred to as upstream ends, and end portions at the downstream side in the counterclockwise direction of the inductor conductor layers 66a, 66b, 68a, and 68b are referred to as downstream ends.

The via hole conductor v28 penetrates through the insulator layers 16h to 16j in the up-down direction, and connects the downstream ends of the inductor conductor layers 66a and 66b with the upstream ends of the inductor conductor layers 68a and 68b. Accordingly, the inductor L5 includes a spiral shape or a substantially spiral shape extending to the lower side while looped in the counterclockwise direction when viewed from the upper side.

One end of the inductor L5, which includes the upstream ends of the inductor conductor layers 66a and 66b, is connected with the other end of the inductor L4, which includes the downstream ends of the inductor conductor layers 64a and 64b. The other end of the inductor L5, which includes the downstream ends of the inductor conductor layers 68a and 68b, is connected with the outer electrode 14c via the connection conductor layer 74 and the via hole conductors v29 and v30. The connection conductor layer 74 is a conductor layer provided at or near the front right corner of the top surface of the insulator layer 16z, and includes a linear or a substantially linear shape extending in the left-right direction. The via hole conductor v29 penetrates through the insulator layers 16j to 16y in the up-down direction, and connects the downstream ends of the inductor conductor layers 68a and 68b with a left end of the connection conductor layer 74. The via hole conductor v30 penetrates through the insulator layers 16z and 16aa in the up-down direction, and connects a right end of the connection conductor layer 74 with the outer electrode 14c.

The capacitor C5 includes the capacitor conductor layers 70a, 70b, and 72. The capacitor conductor layer 70b is a conductor layer provided in a left half region of the top surface of the insulator layer 16o, and includes a rectangular or a substantially rectangular shape. The capacitor conductor layer 72 is a conductor layer provided in a left half region of the insulator layer 16n, and includes a rectangular or a substantially rectangular shape. The capacitor conductor layer 72 faces the capacitor conductor layer 70a with the insulator layer 16m located between the capacitor conductor layer 72 and the capacitor conductor layer 70a, and faces the capacitor conductor layer 70b with the insulator layer 16n located between the capacitor conductor layer 72 and the capacitor conductor layer 70b.

One electrode of the capacitor C5, included in the capacitor conductor layers 70a and 70b, is connected with the other end of the inductor L4, which includes the downstream ends of the inductor conductor layers 64a and 64b, and one end of the inductor L5, which includes the upstream ends of the inductor conductor layers 66a and 66b, through the via hole conductor v27. The via hole conductor v27 penetrates through the insulator layers 16h to 16l in the up-down direction, and connects the downstream ends of the inductor conductor layers 64a and 64b and the upstream ends of the inductor conductor layers 66a and 66b with the capacitor conductor layer 70a. The via hole conductor v35 penetrates through the insulator layers 16m and 16n in the up-down direction, and connects the capacitor conductor layers 70a and 70b with each other.

The other electrode of the capacitor C5, included in the capacitor conductor layer 72, is connected with the outer electrode 14c via the connection conductor layer 74 and the via hole conductors v29 and v30.

The LC series resonator LC6 is described below. The capacitor C6 is provided at the multilayer body 12 and includes the capacitor conductor layers 70b and 78. The capacitor conductor layer 78 is a conductor layer provided at or near the rear left corner of the insulator layer 16p, and includes a rectangular or a substantially rectangular shape. The capacitor conductor layer 78 faces the capacitor conductor layer 70b with the insulator layer 16o located between the capacitor conductor layer 78 and the capacitor conductor layer 70b.

One electrode of the capacitor C6, included in the capacitor conductor layer 70b, is connected with the other end of the inductor L4, which includes the downstream ends of the inductor conductor layers 64a and 64b, and one end of the inductor L5, which includes the upstream ends of the inductor conductor layers 66a and 66b, via the capacitor conductor layer 70a and the via hole conductors v27 and v35.

The inductor L6 includes the inductor conductor layer 80. The inductor conductor layer 80 is a conductor layer provided at or near the rear left corner of the top surface of the insulator layer 16u, and includes a linear or a substantially linear shape looped in the clockwise direction. An end portion at the upstream side in the clockwise direction of the inductor conductor layer 80 is referred to as an upstream end, and an end portion at the downstream side in the clockwise direction of the inductor conductor layer 80 is referred to as a downstream end.

One end of the inductor L6, which includes the upstream end of the inductor conductor layer 80, is connected with the other electrode of the capacitor C6, included in the capacitor conductor layer 78, through the via hole conductor v36. The via hole conductor v36 penetrates through the insulator layers 16p to 16t in the up-down direction, and connects the capacitor conductor layer 78 with the upstream end of the inductor conductor layer 80.

The other end of the inductor L6, which includes the downstream end of the inductor conductor layer 80, is connected with the outer electrode 14d via the ground conductor layer 82 and the via hole conductors v37 and v38. The ground conductor layer 82 is a conductor layer provided in a left half region of the top surface of the insulator layer 16z, and includes a rectangular or a substantially rectangular shape. The ground conductor layer 82 is isolated from the ground conductor layer 28. The via hole conductor v37 penetrates through the insulator layers 16u to 16y in the up-down direction, and connects the downstream end of the inductor conductor layer 80 with the ground conductor layer 82. The via hole conductor v38 penetrates through the insulator layers 16z and 16aa in the up-down direction, and connects the ground conductor layer 82 with the outer electrode 14d.

The capacitor C17 is described below. The capacitor C17 includes the ground conductor layer 82 and the capacitor conductor layer 84. The capacitor conductor layer 84 is a conductor layer provided at or near the front left corner of the top surface of the insulator layer 16x, and includes a rectangular or a substantially rectangular shape. The capacitor conductor layer 84 faces the ground conductor layer 82 with the insulator layers 16x and 16y located between the capacitor conductor layer 84 and the ground conductor layer 82.

One electrode of the capacitor C17, included in the capacitor conductor layer 84, is connected with the other electrode of the capacitor C5, included in the capacitor conductor layer 72, and the other end of the inductor L5, which includes the downstream ends of the inductor conductor layers 68a and 68b, through the via hole conductor v29. The other electrode of the capacitor C17, in the ground conductor layer 82, is connected with the outer electrode 14d through the via hole conductor v38.

With the diplexer 10a configured as described above, the attenuation in the high frequency region outside the pass band of the band pass filter BPF is able to be increased. More specifically, the diplexer 10a includes the inductor L100. The inductor L100 includes the two via hole conductors v15 and v16, and the inductor conductor layers 50a and 50b. In the inductor L100, the stray capacitance, that is, the capacitor Cp, is generated between the two via hole conductors v15 and v16. Accordingly, the LC parallel resonator LC100 including the inductor L100 and the capacitor Cp is connected between the band pass filter BPF and the outer electrode 14b. The LC parallel resonator LC100 has a resonant frequency f100. The shape of the inductor L100 may be changed to adjust the inductance value of the inductor L100 and the capacitance value of the capacitor Cp to provide the resonant frequency f100 at or near a cutoff frequency at the high frequency side of the band pass filter BPF. With the configuration described above, the attenuation in the high frequency region outside the pass band of the band pass filter BPF of the diplexer 10a is able to be increased.

A computer simulation was executed as described below to confirm that the attenuation in the high frequency region outside the pass band of the band pass filter BPF is able to be increased in the diplexer 10a. More specifically, a first model was created with the structure of the diplexer 10a as an example, and a second model was created with a structure in which the inductor L100 was removed from the diplexer 10a as a comparative example. In the second model, the impedance was varied when the inductor L100 was removed, and the impedance was corrected and then the second model was evaluated.

Figure 7A:
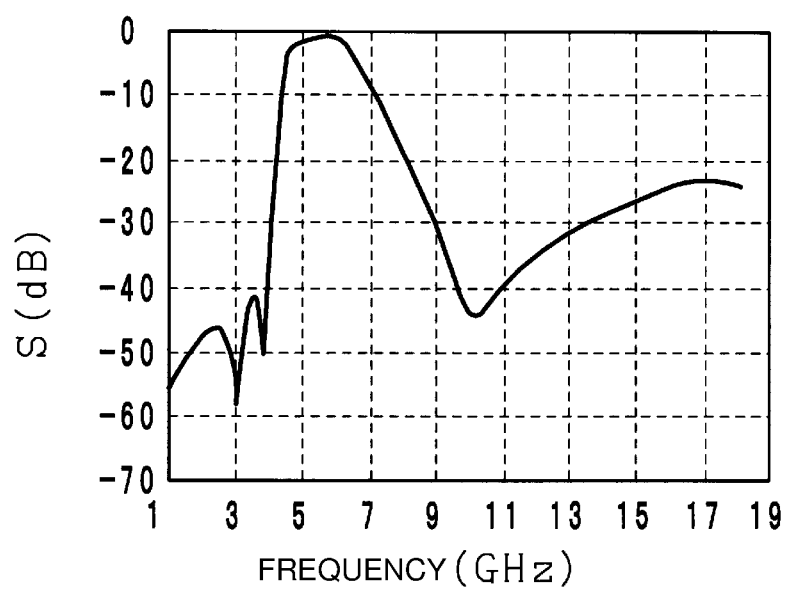
FIG. 7A is a graph showing a simulation result of a first model according to the first preferred embodiment of the present invention.
Figure 7B:
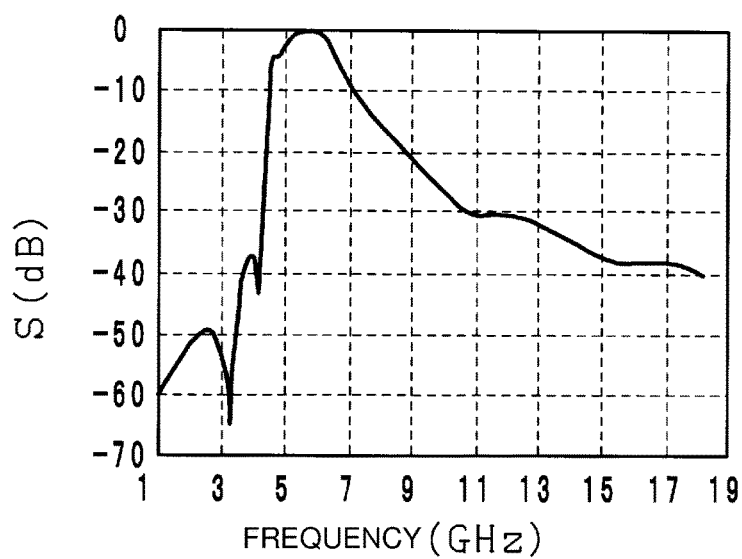
FIG. 7B is a graph showing a simulation result of a second model according to the first preferred embodiment of the present invention.

FIG. 7A is a graph showing a simulation result of the first model. FIG. 7B is a graph showing a simulation result of the second model. The vertical axis plots bandpass characteristic and the horizontal axis plots frequency. The bandpass characteristic is a value of a ratio of the intensity of a high frequency signal input from the outer electrode 14a to the intensity of a high frequency signal output from the outer electrode 14b.

FIGS. 7A and 7B show that an attenuation pole is generated at or near 10 GHz in the first model, and an attenuation pole is not generated at or near 10 GHz in the second model. That is, if the inductor L100 is provided, the attenuation pole is generated at or near 10 GHz. The value 10 GHz is the cutoff frequency at the high frequency side of the band pass filter BPF. Accordingly, the attenuation in the high frequency region outside the pass band of the band pass filter BPF is able to be increased in the diplexer 10a by the simulation described above.

The diplexer 10a is able to reduce the overall size of an electronic component. A diplexer including a capacitor in which a first capacitor conductor layer and a second capacitor conductor layer face each other with an insulator layer located between the first capacitor conductor layer and the second capacitor conductor layer, instead of the capacitor Cp of the diplexer 10a, is described as a diplexer according to a comparative example. The configuration of the diplexer according to the comparative example is similar to the diplexer 10a and the reference signs of the diplexer 10a are also included for reference signs of respective configurations of the diplexer according to the comparative example.

To increase the attenuation in the high frequency region outside the pass band of the diplexer according to the comparative example, as described above, the LC parallel resonator LC100 may be connected between the band pass filter BPF and the outer electrode 14b. When the LC parallel resonator LC100 is provided, in general, the first capacitor conductor layer is connected with the via hole conductor v15 and the second capacitor conductor layer is connected with the via hole conductor v16. The first capacitor conductor layer faces the second capacitor conductor layer with the insulator layer located between the first capacitor conductor layer and the second capacitor conductor layer, and thus the capacitor is connected in parallel with the inductor L100.

However, if the first and second capacitor conductor layers define the capacitor, a space is required for the first and second capacitor conductor layers in the diplexer according to the comparative example. Consequently, the space results in an increase in size of the diplexer according to the comparative example.

In the diplexer 10a, a capacitor including at least two conductor layers respectively connected with the via hole conductor v15 and the via hole conductor v16 is not present. Instead, the stray capacitance generated between the via hole conductor v15 and the via hole conductor v16 provides the capacitor Cp. That is, in the diplexer 10a, a capacitor is not provided by adding conductor layers, but the capacitor Cp is provided by the stray capacitance generated in the inductor L100. Accordingly, the size of the diplexer 10a is able to be relatively small, when compared with the size of the diplexer according to the comparative example.

The diplexer 10a is also able to reduce the overall size of an electronic component as described below. As shown in FIG. 6, the loop surface S100 of the inductor L100 is located between the loop surface S2 of the inductor L2 and the loop surface S3 of the inductor L3. That is, the loop surface S100 is located within a region where the band pass filter BPF is provided in the left-right direction. In the diplexer 10a, it is not required to newly add the space for providing the inductor L100. Accordingly, the diplexer 10a may have a relatively small size.

In the diplexer 10a, interference of electromagnetic coupling between the inductor L2 and the inductor L3 by the inductor L100 is significantly reduced or prevented. More specifically, the loop surfaces S2 and S3 are accommodated within the loop surface S100 and do not protrude from the loop surface S100 when viewed from the right side. Accordingly, passing of magnetic fluxes generated by the inductors L2 and L3 through the inductor conductor layers 50a and 50b and the via hole conductors v15 and v16 of the inductor L100 is significantly reduced or prevented. Consequently, interference of electromagnetic coupling between the inductor L2 and the inductor L3 by the inductor L100 is reduced.

In the diplexer 10a, by adjusting the lengths of the inductor conductor layers 50a and 50b and the via hole conductors v15 and v16, the inductance value of the inductor L100 is able to be adjusted, and the resonant frequency f100 of the LC parallel resonator LC100 is able to be adjusted.

Modification of the First Preferred Embodiment

Figure 8:
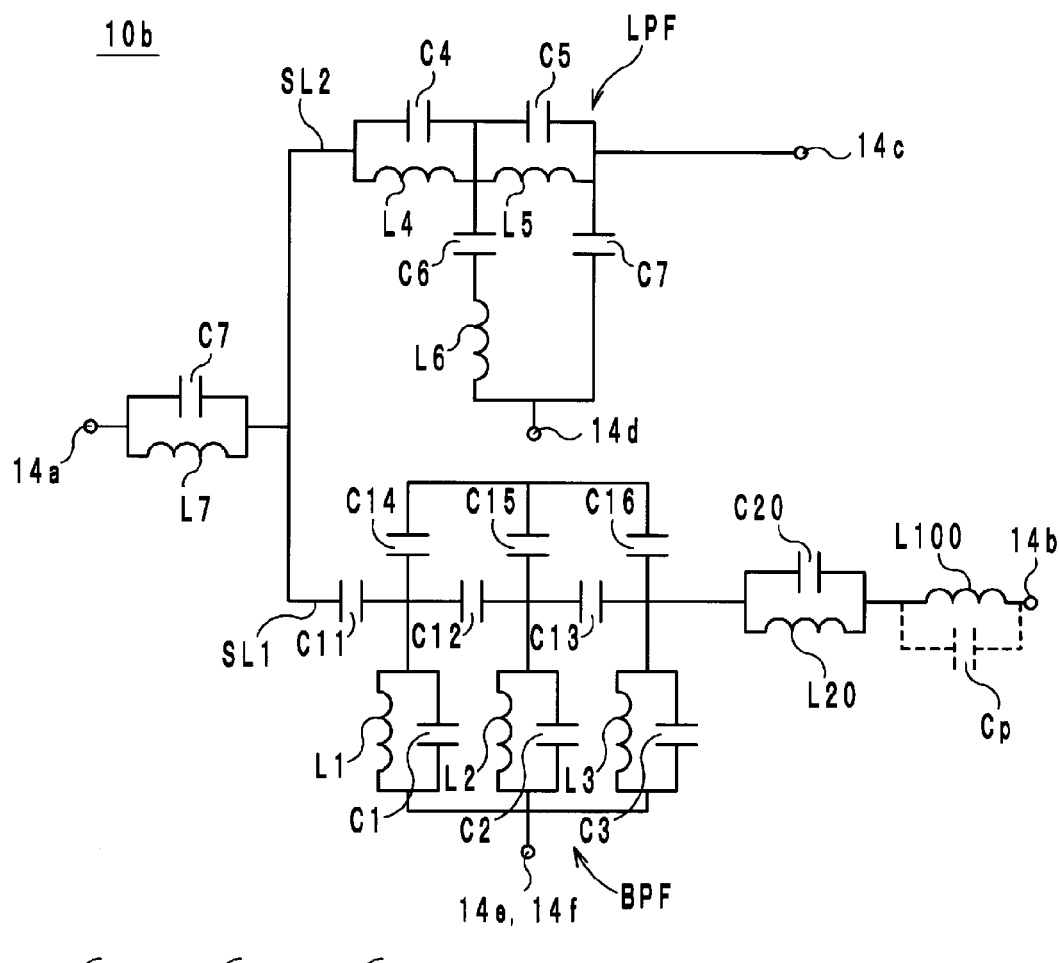
FIG. 8 is an equivalent circuit diagram of a diplexer according to a modification of the first preferred embodiment of the present invention.
Figure 9:
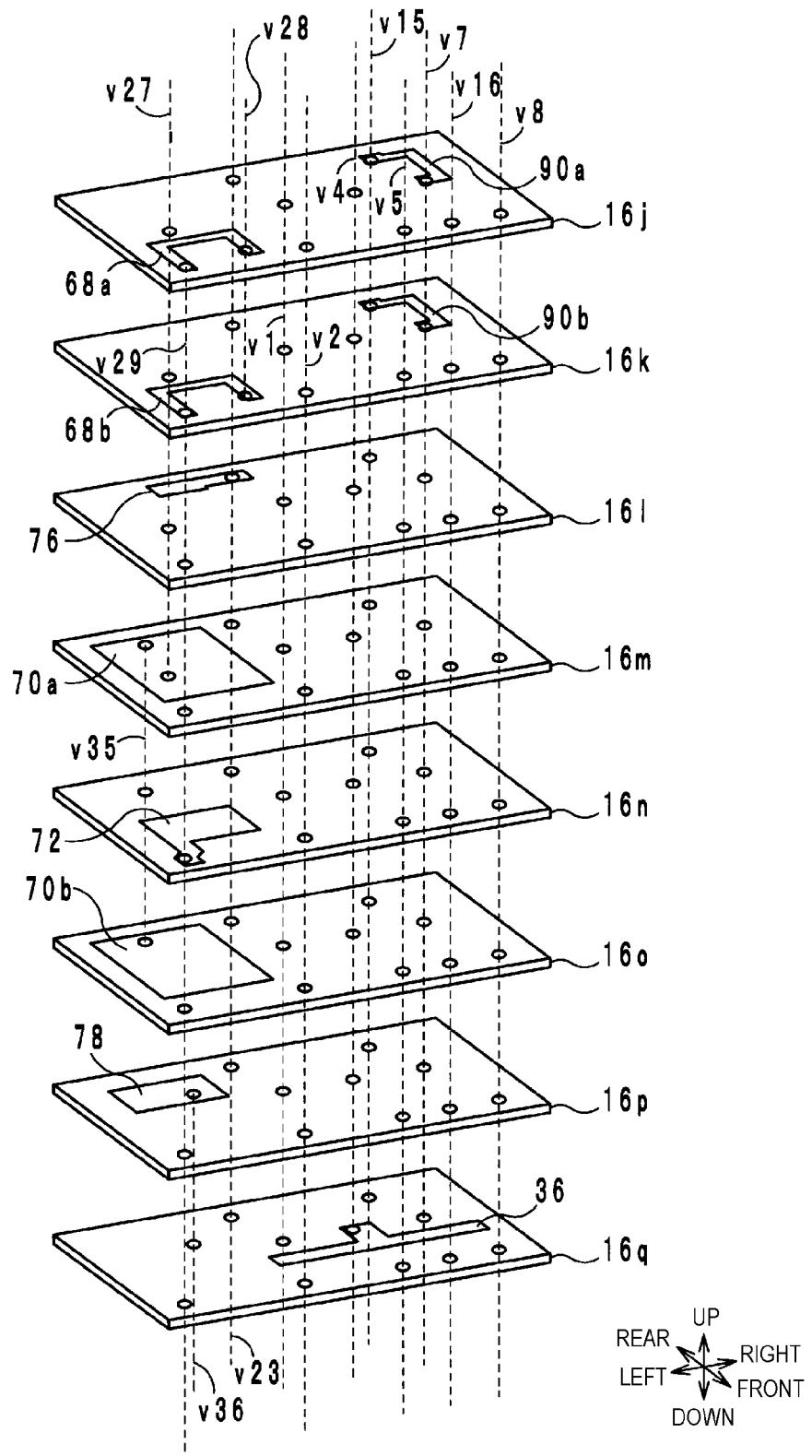
FIG. 9 is an exploded perspective view of the diplexer according to a modification of the first preferred embodiment of the present invention.
Figure 10:
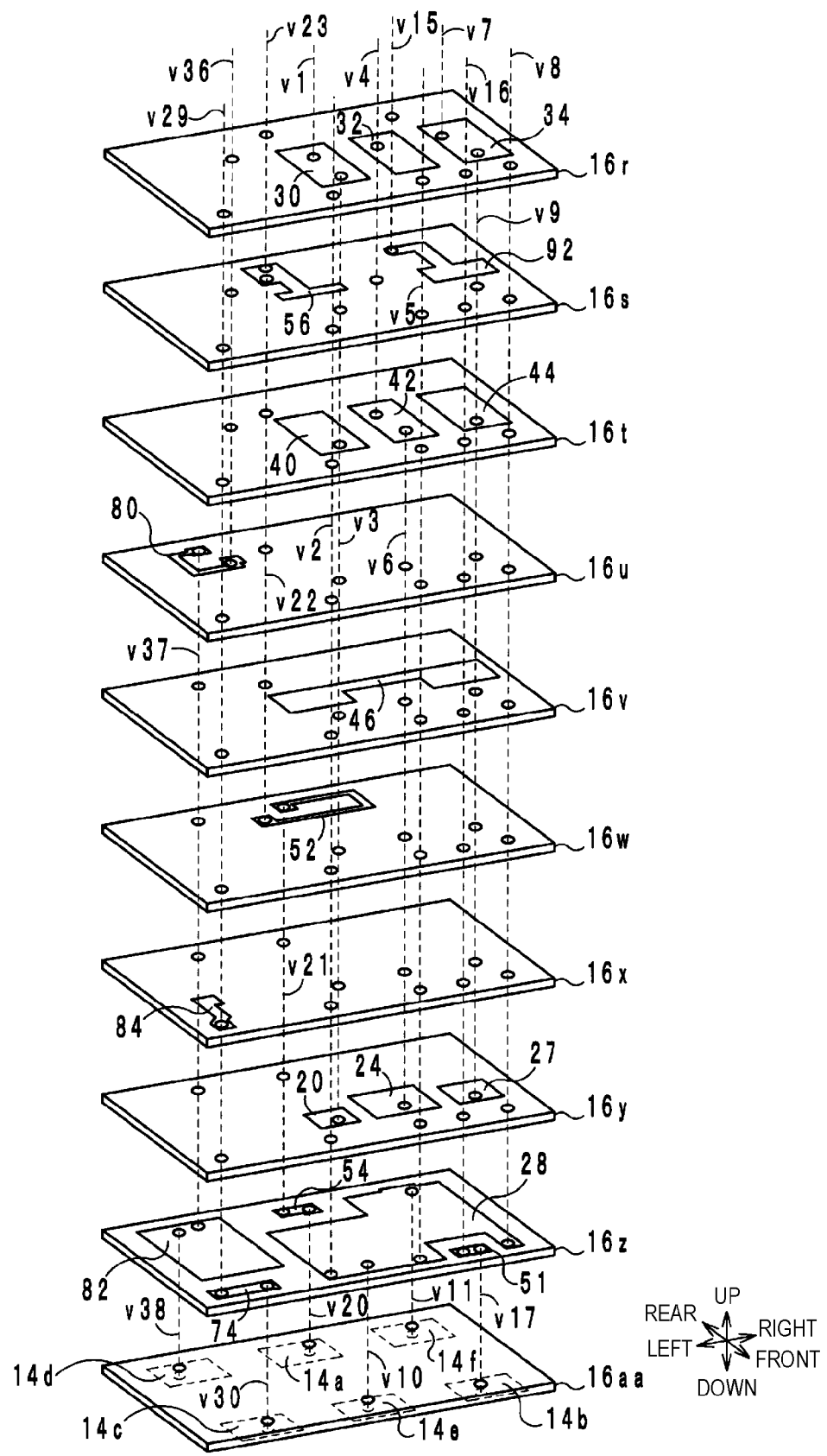
FIG. 10 is an exploded perspective view of the diplexer according to a modification of the first preferred embodiment of the present invention.

A diplexer 10b according to a modification of the first preferred embodiment is described below with reference to the drawings. FIG. 8 is an equivalent circuit diagram of the diplexer 10b according to the modification. FIGS. 9 and 10 are exploded perspective views of the diplexer 10b. The structure from the insulator layer 16a to the insulator layer 16i of the diplexer 10b is the same or substantially the same as the structure from the insulator layer 16a to the insulator layer 16i of the diplexer 10a as shown in FIG. 3.

The diplexer 10b is different from the diplexer 10a in that the diplexer 10b further includes an LC parallel resonator LC20. The diplexer 10b is described below, primarily with respect to the LC parallel resonator LC20.

As shown in FIG. 8, the LC parallel resonator LC20 is connected between the band pass filter BPF and the LC parallel resonator LC100, and includes an inductor L20 and a capacitor C20. The inductor L20 and the capacitor C20 are connected in parallel.

As shown in FIG. 9, the inductor L20 includes inductor conductor layers 90a and 90b. The inductor conductor layers 90a and 90b are conductor layers respectively provided at or near the rear right corners of the top surfaces of the insulator layers 16j and 16k, and include linear or substantially linear shapes looped in the counterclockwise direction when viewed from the upper side. The inductor conductor layer 90a and the inductor conductor layer 90b include the same or substantially the same shape, and overlap each other when viewed from the upper side. End portions at the upstream side in the counterclockwise direction of the inductor conductor layers 90a and 90b are referred to as upstream ends, and end portions at the downstream side in the counterclockwise direction of the inductor conductor layers 90a and 90b are referred to as downstream ends.

The upstream ends of the inductor conductor layers 90a and 90b are connected with the via hole conductor v7, and one end of the inductor L20 is connected with the inductor L3. The downstream ends of the inductor conductor layers 90a and 90b are connected with the via hole conductor v15, and the other end of the inductor L20 is connected with the inductor L100.

The capacitor C20 includes capacitor conductor layers 34, 44, and 92. The capacitor conductor layer 34 of the diplexer 10b is not connected with the via hole conductor v15. The capacitor conductor layer 92 is a conductor layer provided in a right half region of the top surface of the insulator layer 16s. The capacitor conductor layer 92 faces the capacitor conductor layer 34 with the insulator layer 16r located between the capacitor conductor layer 92 and the capacitor conductor layer 34, and faces the capacitor conductor layer 44 with the insulator layer 16s located between the capacitor conductor layer 92 and the capacitor conductor layer 44.

One electrode of the capacitor C20 (the capacitor conductor layers 32, 34, 42, and 44) is connected with one electrode of the capacitor C3 (the capacitor conductor layer 27), the other electrode of the capacitor C13 (the capacitor conductor layer 36), and one electrode of the capacitor C16. The one electrode of the capacitor C20 is included in the capacitor conductor layers 32, 34, 42, and 44, the one electrode of the capacitor C3 is included in the capacitor conductor layer 27, the other electrode of the capacitor C13 is included in the capacitor conductor layer 6, and the one electrode of the capacitor C16 is included in the capacitor conductor layer 44.

The diplexer 10b configured as described above is able to attain advantageous effects similar to those of the diplexer 10a.

In the diplexer 10b, the LC parallel resonator LC20 operates as a trap circuit. Accordingly, an attenuation pole is able to be provided at or near the pass band frequency at the high frequency side of the band pass filter BPF, and the attenuation at the high frequency side outside the pass band of the band pass filter BPF is able to be increased.

Figure 11:
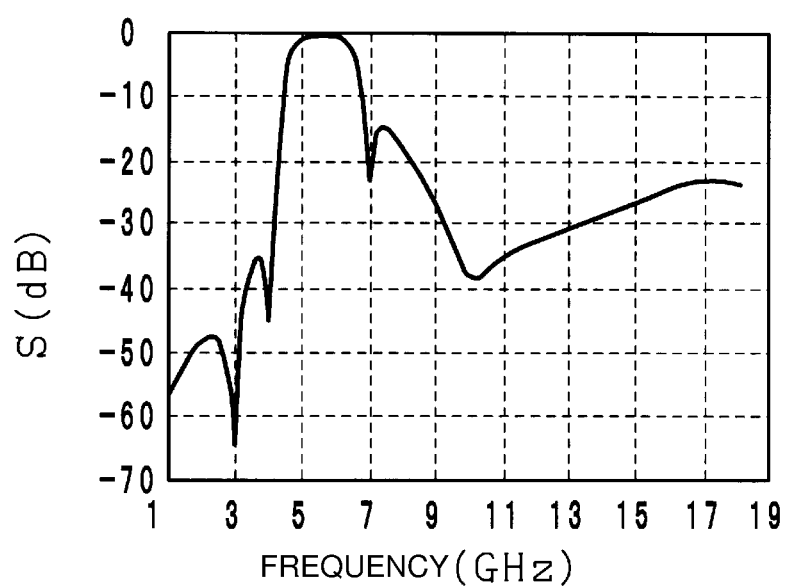
FIG. 11 is a graph showing a simulation result of a third model according to the first preferred embodiment of the present invention.

A computer simulation was executed as described below to confirm that the attenuation in the high frequency region outside the pass band of the band pass filter BPF is able to be increased in the diplexer 10b. More specifically, a third model was created with the structure of the diplexer 10b as an example. FIG. 11 is a graph showing a simulation result of the third model.

FIG. 11 shows that, in the third model, an attenuation pole is generated at or near 7 GHz. That is, if the LC parallel resonator LC20 is provided, the attenuation pole is generated at or near 7 GHz. Accordingly, the attenuation in the high frequency region outside the pass band of the band pass filter BPF is able to be increased in the diplexer 10b by this simulation.

Other Preferred Embodiments

The electronic components according to preferred embodiments of the present invention are not limited to the diplexer 10a or 10b.

It is to be noted that the various elements, features, and configurations of the diplexers 10a and 10b may be desirably combined.

According to a preferred embodiment of the present invention, a diplexer may be omitted from the electronic component. For example, the electronic component may be an electronic component including a filter instead of a diplexer, for example.

The diplexers 10a and 10b each include the band pass filter BPF and the low pass filter LPF. However, each may include a band pass filter BPF' instead of the low pass filter LPF. The pass band of the band pass filter BPF' is lower than the pass band of the band pass filter BPF.

The inductor conductor layers 18a and 18b each include a shape with a rear end bent to the right side when viewed from the upper side. However, the inductor conductor layers 18a and 18b may each include a shape whose rear end is not bent to the right side, or a shape with a rear end bent to the left side. The inductor conductor layers 18a and 18b may each include a shape with a front end bent to the right side, or a shape with a front end bent to the left side when viewed from the upper side. Whether or not the inductor conductor layers 18a and 18b are bent at both ends and the direction of bending is determined in accordance with the intensity of electromagnetic coupling between the inductor L1 and the inductor L2. Specifically, if capacitive coupling is strong and inductive coupling increases as the distance between the inductor L1 and the inductor L2 is decreased, the pass band of the band pass filter is narrowed. Similarly, if capacitive coupling is strong and inductive coupling decreases as the distance between the inductor L1 and the inductor L2 is increased, the pass band of the band pass filter is widened. The inductor conductor layers 26a and 26b are similar to the inductor conductor layers 18a and 18b as described above.

The inductor conductor layers 50a and 50b are preferably longer than the inductor conductor layers 18a, 18b, 22a, 22b, 26a, and 26b. However, the inductor conductor layers 50a and 50b may be shorter than the inductor conductor layers 18a, 18b, 22a, 22b, 26a, and 26b, when viewed from the upper side, to decrease the inductance value of the inductor L100.

In each of the diplexers 10a and 10b, the via hole conductors v15 and v16 of the inductor L100 may be longer than the via hole conductors v1, v2, v4, v5, v7, and v8 of the inductors L1 to L3 or may be shorter than the via hole conductors v1, v2, v4, v5, v7, and v8 of the inductors L1 to L3. If the via hole conductors v15 and v16 are longer than the via hole conductors v1, v2, v4, v5, v7, and v8, the inductance value of the inductor L100 is increased. If the via hole conductors v15 and v16 are shorter than the via hole conductors v1, v2, v4, v5, v7, and v8, the inductance value of the inductor L100 is decreased. That is, the inductance value of the inductor L100 is able to be adjusted by adjusting the lengths of the via hole conductors v15 and v16. Accordingly, since the value of the inductor L100 is changed, the capacitor Cp is changed, and the attenuation pole frequency is changed.

Figure 12:
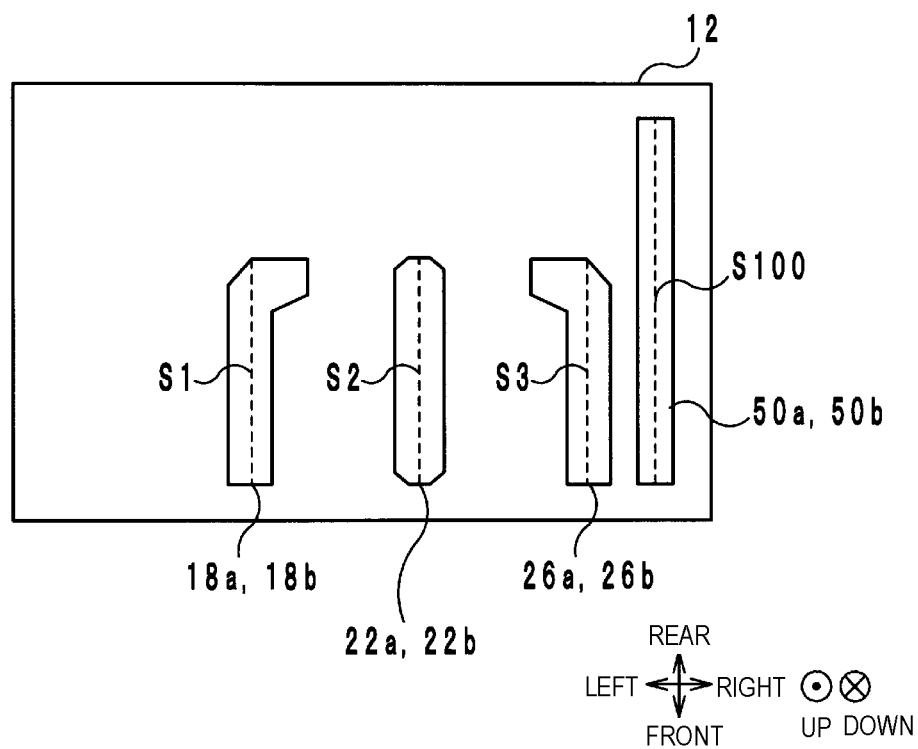
FIG. 12 is a perspective view of insulator layers of a diplexer according to another preferred embodiment of the present invention from the upper side.

It is not necessary that the inductor L100 be arranged between the inductor L2 and the inductor L3. FIG. 12 is a perspective view of the insulator layers 16b to 16d of a diplexer 10c according to a second preferred embodiment of the present invention, viewed from the upper side.

In the diplexer 10c, the inductor L100 is provided at the right side of the inductor L3. That is, the loop surface S2, the loop surface S3, and the loop surface S100 are arranged in that order from the left side to the right side when viewed from the upper side. Further, a loop via inductor other than the inductor L100 is not provided at the right side of the loop surface S3. Accordingly, the loop surface S100 may not be located within the region where the band pass filter BPF is provided in the left-right direction.

As described above, preferred embodiments of the present invention provide an increase in the attenuation in the high frequency region outside the pass band.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. An electronic component comprising:
a multilayer body including a plurality of insulator layers laminated in a laminate direction;
a filter provided at the multilayer body;
an input/output terminal provided at the multilayer body; and
an impedance-matching loop via inductor; wherein
the impedance-matching loop via inductor is an impedance-matching inductor provided at the multilayer body and connected between the filter and the input/output terminal, and includes an impedance-matching inductor conductor layer and first and second impedance-matching via hole conductors extending from the impedance-matching inductor conductor layer in the laminate direction;
a capacitor including at least two capacitor conductor layers is not connected between the impedance-matching loop via inductor and the input/output terminal; and
a stray capacitance is generated between the first and second impedance-matching via hole conductors.

2. The electronic component according to claim 1, wherein:
a direction in which the impedance-matching inductor conductor layer extends is a first direction;
a direction orthogonal or substantially orthogonal to the laminate direction and the first direction is a second direction;
the filter includes:
a first inductor-capacitor parallel resonator with a first loop via inductor including a first inductor conductor layer extending in the first direction and first and second via hole conductors extending from the first inductor conductor layer in the laminate direction; and
a second inductor-capacitor parallel resonator with a second loop via inductor including a second inductor conductor layer extending in the first direction and third and fourth via hole conductors extending from the second inductor conductor layer in the laminate direction;
an impedance-matching loop surface is surrounded by the impedance-matching loop via inductor;
a first loop surface is surrounded by the first inductor-capacitor parallel resonator;
a second loop surface is surrounded by the second inductor-capacitor parallel resonator;
the first and second loop surfaces face each other and the first and second inductor-capacitor parallel resonators are electromagnetically coupled with each other; and
the impedance-matching loop surface faces the first and second loop surfaces.

3. The electronic component according to claim 2, wherein the impedance-matching loop surface is located between the first and second loop surfaces in the second direction.

4. The electronic component according to claim 3, wherein the first loop surface and the second loop surface are located within the impedance-matching loop surface and do not protrude from the impedance-matching loop surface when viewed from the second direction.

5. The electronic component according to claim 2, wherein the first loop surface, the second loop surface, and the impedance-matching loop surface are arranged in that order in the second direction.

6. The electronic component according to claim 2, wherein the first and second impedance-matching via hole conductors are longer than the first to fourth via hole conductors.

7. The electronic component according to claim 2, wherein the impedance-matching inductor conductor layer is longer than the first and second inductor conductor layers.

8. The electronic component according to claim 2, wherein the impedance-matching inductor conductor layer is shorter than the first and second inductor conductor layers.

9. The electronic component according to claim 2, wherein the second loop surface is located between the first loop surface and the impedance-matching loop surface in the second direction.

10. The electronic component according to claim 1, wherein the filter is a first band pass filter.

11. The electronic component according to claim 10, further comprising:
   a low pass filter or a second band pass filter; and
   a diplexer including the filter and the low pass filter or the second band pass filter.

12. The electronic component according to claim 11, wherein the second band pass filter includes a ground conductor, and the impedance-matching inductor overlaps the ground conductor of the second band pass filter when viewed in the laminate direction.

13. The electronic component according to claim 1, wherein:
   the impedance-matching inductor conductor layer is a first impedance-matching inductor conductor layer; and
   the impedance-matching loop via inductor further includes a second impedance-matching inductor conductor layer.

14. The electronic component according to claim 13, wherein the first impedance-matching inductor conductor layer and the second impedance-matching inductor conductor layer include a same or substantially a same shape.

15. The electronic component according to claim 13, wherein the first impedance-matching inductor conductor layer and the second impedance-matching inductor conductor layer overlap each other when viewed in the laminate direction.

* * * * *